March 5, 1968 E. G. TEFFT 3,372,318

SEMICONDUCTOR SWITCHES

Filed Jan. 22, 1965 2 Sheets-Sheet 1

INVENTOR:
EDWARD G. TEFFT,

BY

HIS ATTORNEY.

INVENTOR:
EDWARD G. TEFFT,
BY Urban H. Faubion
HIS ATTORNEY.

3,372,318
SEMICONDUCTOR SWITCHES
Edward G. Tefft, Auburn, N.Y., assignor to General Electric Company, a corporation of New York
Filed Jan. 22, 1965, Ser. No. 427,393
4 Claims. (Cl. 317—235)

ABSTRACT OF THE DISCLOSURE

A semiconductor bilateral gate fired switch is provided which utilizes both junction and remote gate firing modes and a confined localized low resistance current path is provided between the gate electrode and the nearest device main emitter junction in order to assure that the current density required for switching the device is obtained at a low value of gate current and to achieve gate firing with a low gate voltage.

This invention relates to bidirectional (bilateral) semiconductor switches of the type which can be switched between two states of impedance, i.e., between a high impedance and a low impedance, for current conduction in both directions through the semiconductor device. More particularly, the invention relates to such devices wherein a gate or control electrode provides control for both parts of the output of an alternating power source applied between a pair of main device electrodes.

The three lead bidirectional semiconductor switch has become an important component in a wide variety of control applications. Such devices are described and claimed in a number of copending patent applications which are assigned to the assignee of the present application, e.g. Ser. No. 838,504 entitled, "Semiconductor Devices and Methods of Making Same," filed Sept. 8, 1959, in the name of Nick Holonyak, Jr., and Richard W. Aldrich; Ser. No. 331,776, now Patent No. 3,275,909 entitled, "Semiconductor Switch," filed Dec. 19, 1963, in the name of Frank W. Gutzwiller and Ser. No. 337,384 entitled, "Semiconductor Switch," filed Jan. 13, 1964, in the name of Finis E. Gentry.

The three lead bidirectional switch is made an active element in circuit applications by connecting its two main current carrying terminals in the circuit to be controlled. With the switch in its "off" condition, it acts as a high impedance element; except for a small leakage current, the switch acts as an open circuit. When the switch is in its "on" condition, it presents a very low impedance (essentially a short circuit) to current. The current may be turned on for a voltage applied across its main terminals in either direction or in both directions. In other words, it may act as a high impedance element to current in both directions or a high impedance element to current in one direction and essentially a short circuit to current in the opposite direction or it may operate as a low impedance element to current in both directions. Further, the time during any half cycle of an alternating source at which the switch may be rendered conductive may be varied. The usual mechanism for rendering the switch conductive is to apply a voltage to introduce or extract current from a third lead or terminal (called the triggering or gate lead) which increases current flowing through the device and thereby renders the device conductive. This action is descriptively referred to as triggering the device or turning it on.

For bidirectional switches as contemplated here a single terminal (gate terminal) is used to turn the device on for current flow in either direction through the device. Thus, different carrier movements take place and different current paths are utilized for "turn on" for opposite directions of load current flow. This means that a different firing mode is utilized for opposite directions of current flow. As a consequence, it is difficult to obtain firing for both directions of current flow with the same magnitude of gate voltage and current. It is highly desirable that, for both directions of current conduction through the switch, the gate voltage and current to fire be similar. Accordingly, it is an object of the present invention to provide a means for rendering gate firing characteristics of a bidirectional semiconductor switch more nearly symmertical for both directions of conduction.

It is also highly desirable to provide for gate firing at the lowest possible value of total gate current and voltage. Accordingly, it is an object of the present invention to concentrate gate current so that the current density required for switching the device from the high impedance to the low impedance state may be obtained at a lower value of total gate current and voltage.

In carrying out the present invention a single three lead (three terminal) semiconductor device is provided which controls both polarities of the output of an alternating power source. In order to assure that the current density required for switching the device is obtained at a low value of gate current and to achieve gate firing with a low gate voltage, a confined localized low resistance current path is provided between the gate electrode and the nearest main emitter junction.

The features which are believed to be characteristic of the invention are set forth with particularity in the appended claims. The invention itself, however, both as to its organization and advantages thereof may best be understood by reference to the following description taken in connection with the accompanying drawings in which:

Figure 1:
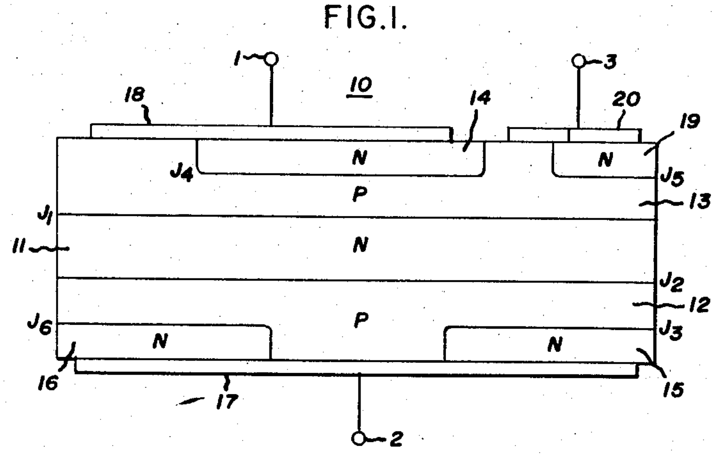
FIGURE 1 is a diagrammatic sectional view of one embodiment of a three lead bidirectional switch constructed in accordance with the principles of the present invention and taken along section lines I—I of FIGURE 2.
Figure 2:
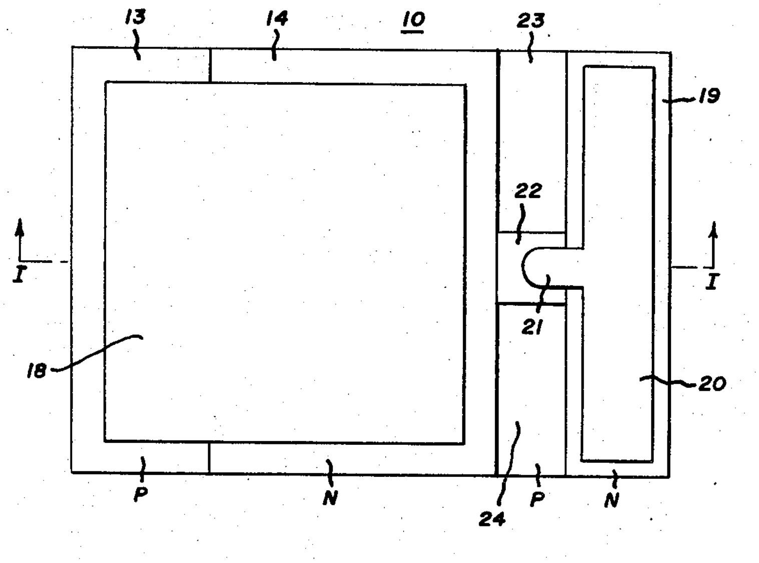
FIGURE 2 is a plan view of the three lead bidirectional switch illustrated in FIGURE 1.

Referring to the device of FIGURES 1 and 2 (particularly the cross-sectional view of FIGURE 1) a bidirectional controllable semiconductor switch is illustrated. The switch has three terminals 1, 2 and 3 which are intended to be connected in the circuit wherein the switch is employed. The upper and lower main current carrying terminals 1 and 2 respectively are connected in a main current-carrying path of the circuit and gate terminal 3 is connected to a source which supplies a turn-on signal of proper polarity when the current path between the main terminals 1 and 2 is to be rendered highly conductive. The device illustrated is one which can be turned on with either a negative or a positive bias (gate current) relative to upper main electrode 1. Thus, if lower main electrode 2 is either positive or negative relative to upper main electrode 1, either a positive or a negative gate current will trigger the device into conduction.

In the embodiment illustrated in FIGURES 1 and 2 (see particularly FIGURE 1) the semiconductor pellet 10 may be considered a five layer device which has an internal N conductivity type base region or layer 11 and P conductivity type regions or layers 12 and 13 on opposite sides. The two P type layers 12 and 13 perform different functions for conduction in opposite senses through the pellet 10. For example, when the lower main terminal 2 is positive relative to upper main terminal 1, the lower (i.e., lower in the figure) P type layer 12 operates as an emitter and the junction $J_2$ between the lower P type layer 12 and internal N type layer 11 is considered an emitter junction. Under these conditions, the upper (internal) P type region 13 constitutes a base region which is separated from the N type base region 11 by junction $J_1$. When the polarity between the main terminals is reversed (upper main terminal 1 positive relative to lower main terminal 2) the upper P type layer 13 constitutes an emitter and the lower P type layer 12 constitutes an internal base layer.

An upper N conductivity type region or layer 14 is formed adjacent or contiguous with a portion of the internal P type base layer 13 and is separated therefrom by a rectifying junction $J_4$. As illustrated, this N type region 14 is spaced from both sides of the device. When the lower device terminal 2 is positive relative to upper terminal 1, upper N type region 14 constitutes an emitter region and the adjacent junction $J_4$ an emitter junction. The upper N type region 14 is referred to as a main emitter region. It does not constitute a part of the active main current path of the device for conduction in the opposite direction.

In order to provide a corresponding emitter and emitter junciton for conduction in the opposite sense (i.e., upper terminal 1 positive with respect to lower terminal 2), a pair of lower N conductivity type regions 15 and 16 are formed adjacent or contiguous with a part of lower P type region 12 and form rectifying junctions $J_3$ and $J_6$ respectively (emitter junctions for this polarity). The lower N type regions 15 and 16 are only contiguous with part of the lower P type region 12 and are spaced apart to leave an exposed surface area of the lower P type region 12 under the upper N type external emitter region 14. Thus, upper N type region 14 overlaps the exposed portion of lower P type region 12 for conduction purposes. Further, the lower N type emitter regions 15 and 16 have portions which extend under a portion of upper N type emitter region 14 and other portions which are opposite exposed portions of upper P type region 13 to form overlaps for conduction purposes.

The contacts for the main current conduction path through the device are made by providing low resistance ohmic contacts 17 and 18 on the lower and upper major faces respectively of pellet 10. The lower electrode or contact 17 contacts both the lower external N type regions 15 and 16 and the exposed portion of the next adjacent (lower) P type region 12. Thus, lower electrode 17 shorts the junctions $J_3$ and $J_6$. The upper main electrode 18 extends over the external N type emitter region 14 and the exposed portion of upper P type region 13 which is opposite (over) lower N type region 16 and thus shorts the upper junction $J_4$. The electrodes 17 and 18 are electrically connected to main terminals 2 and 1 respectively.

In order to provide gate control, an N type gate emitter region 19 is provided adjacent to the portion of upper P type region 13 and near the upper external N type emitter region 14 but on the opposite side of the region 14 from that over which the upper main electrode 18 extends to contact the upper P type region 13. The rectifying junction defined between the upper N type gate region 19 and adjacent P type region 13 is designated as $J_5$. A low resistance ohmic contact or electrode 20 is formed on the gate region 19 in order to provide a means of electrical connection to gate terminal 3. It will be noted that the gate contact 20 extends over the gate emitter junction $J_5$ and also contacts the adjacent upper P type region 13 and as may best be seen in FIGURE 2, the portion of gate electrode 21 which contacts the P type region 13 is relatively small in comparison to the portion of the electrode which extends over the N type gate region 19. Further, as illustrated, the small shorting contact portion 21 of gate contact 20 extends on to what may be termed a bridge 22 on the upper major face of the pellet 10. The bridge 22 is formed in this instance by etching grooves 23 and 24 between gate emitter region 19 and upper main emitter region 14 but leaving (as by prior wax masking) the upraised bridge portion 22 of P type material between gate emitter region 19 and upper main emitter region 14. Thus, the combination of the shorting gate contact portion 21 and the bridge 22 form a localized low resistance current path between the gate contact 20 and the upper emitter junction $J_4$. The reason for forming this localized concentrated low resistance current path is to reduce the value of total gate current necessary to provide the required emitter current density for switching the device to its "on" condition and also to reduce the gate voltage required to fire the device.

In order to understand how the use of the localized concentrated low resistance current path reduces the gate current and gate voltage required to fire the device, it is necessary to understand something of how the device operates. Actually, such a device is fired in at least two different modes since it can be fired from the same gate for both polarities between main terminals 1 and 2. The modes of firing which are considered to be of most significance are here called, for convenience of discussion, the junction gate firing mode and the SCR firing mode. Both modes of firing can be used with either polarity between main terminals 1 and 2. However, the junction gate firing mode occurs when the gate terminal 3 is negative relative to upper main terminal 1 and the SCR firing mode occurs when the gate terminal 3 is made positive relative to main terminal 1. Both the firing modes are described in detail in copending patent application, Ser. No. 337,384 entitled Semiconductor Switch, filed Jan. 13, 1964 in the name of Finis E. Gentry and assigned to the assignee of the present invention and also in the book Semiconductor Controlled Rectifiers, Principles and Applications of p-n-p-n Devices, by F. E. Gentry, F. W. Gutzwiller, N. Holonyak, Jr. and E. E. Von Zastrow, copyright 1964 by Prentice-Hall, particularly section 3.9, pp. 143 to 148. Since the firing modes are adequately described elsewhere, the full description of positive and negative carrier movement necessary to switch the device on in either direction is not again discussed here. However, it will be pointed out that junction gate firing is dependent upon injection of electrons from the gate emitter region 19 which occurs when gate terminal 3 is negative relative to upper main terminal 1 and SCR firing occurs when the gate voltage initiates carrier movement from the upper P type base region 13 and electron injection from the main emitter junction $J_4$ which occurs when gate terminal 3 is positive relative to upper main terminal 1.

In general, junction gate firing of the device requires less gate current and less gate voltage than SCR firing. Therefore, in order to reduce the gate current and voltage required for SCR firing and in order to make the firing characteristics more nearly symmetrical for both modes of firing, the gate emitter junction $J_5$ is shorted by providing the extension 21 on gate contact 20. This reduces the required gate current and voltage for SCR firing by virtue of the fact that the gate emitter junction $J_5$ is no longer in series with the gate current path required for SCR firing. However, even with the gate emitter junction $J_5$ shorted, the firing characteristics may not be symmetrical and the gate firing voltage and current may still be higher than desired. According to the present invention, this condition is alleviated by taking advantage of the fact that it is the main emitter current density which causes the device to switch. To the end of increasing the main emitter current density with a reduced gate current and voltage a localized concentrated low resistance current path is provided between the gate electrode 20 and the upper main emitter junction $J_4$ which here is made up of the relatively small extension 21 on gate contact 20 and the bridge or path 22 which is thicker (thicker as measured from the upper major surface to the junction $J_1$ under the emitter junction $J_4$) than any other current path between the gate contact 20 and main emitter junction $J_4$. Since in the structures which have been built the P type layers 12 and 13 were diffused, the low resistance current path is also less by virtue of the fact that the impurity concentration at the upper major surface (preserved on bridge 22) provides a lower resistivity than the material further down toward junction $J_1$.

Figure 3:
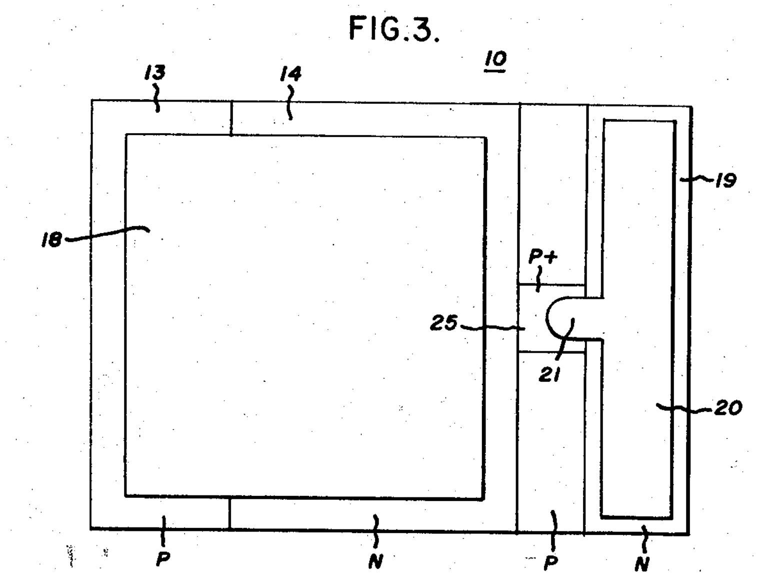
FIGURES 3 and 4 are plan views of other embodiments of three lead bidirectional switches utilizing the present invention.

Another embodiment which provides the concentrated low resistance current path between the gate electrode and main emitter junction to provide essentially the same results is illustrated in FIGURE 3. FIGURE 3 is a plan view of a bidirectional switch which has the same cross-sectional structure as that shown for FIGURE 1 and which has many of the same structural features. Since the devices are so similar, the same reference numerals are utilized to designate corresponding parts and features of the two devices. The device of FIGURE 3 differs from that illustrated in FIGURES 1 and 2 in that the low resistance path 25 between the projection 21 on gate electrode 20 and the main emitter junction $J_4$ is provided by diffusing in a narrow path or bridge which is designated as being P+ to indicate that it is of much lower resistivity material than the upper P type layer 13 although of the same conductivity type. Here there are no grooves etched between the gate emitter region 19 and the upper main emitter region 14 although the effect may be enhanced by etching grooves such as 23 and 24 illustrated in FIGURE 2.

Figure 4:
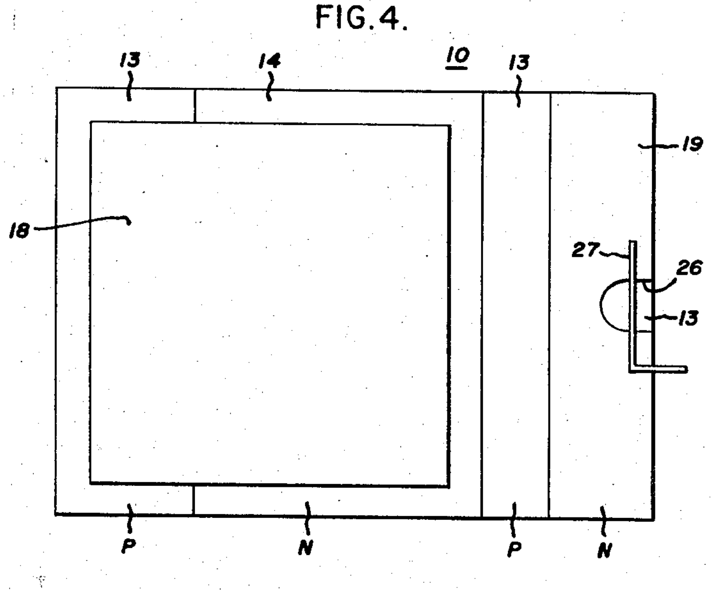

Still another means of providing the low resistance path between the gate contact and the junction under the upper emitter region is illustrated in FIGURE 4. Again, the elements which correspond to those of the device of FIGURES 1 and 2 are given the same reference numerals for simplicity. Here the gate emitter region 19 is provided with an indentation 26 which leaves the adjacent upper P type region 13 exposed and the gate electrode 27 is provided by ultrasonically welding an aluminum gate lead on the gate emitter region in such a manner as to bridge the exposed portion of the upper P type region 13 in the indented part of gate emitter region. Thus, in effect, a small localized short is provided between gate electrode 27 and the upper P type region 13. Since the short is relatively small and localized, the current path between the gate electrode and the main emitter junction $J_4$ is also small and localized.

Many minor modifications in the structure and means of obtaining the structures can be proposed while not departing from the present invention. Thus, while particular embodiments are illustrated, the invention is not limited thereto and it is contemplated that the appended claims will cover such modifications as fall within the true spirit and scope of the invention.

What I claim as new and desire to secure by Letters Patent of the United States is:

1. In a bilateral switching device wherein a gate electrode provides the control for switching the device between conducting and non-conducting states for a current path between a pair of main current carrying electrodes, a semiconductor body having a plurality of alternating regions, adjacent regions being of opposite conductivity type separated by rectifying barriers, one of said regions adjacent one surface of said body constituting a main emitter, said main emitter formed in the next adjacent region in such a manner as to be defined by at least a pair of extended spaced essentially parallel lines formed by intersections with the said one surface of the semiconductor body of the rectifying barrier between said main emitter and said next adjacent region whereby said next adjacent region is exposed at said one surface on both sides of said main emitter region, a main current carrying electrode in ohmic contact with said one surface of said body and extending over at least a portion of both said main emitter and said next adjacent region on only one side of said main emitter region thereby extending over a major portion of one of said extended intersections with the said surface of the rectifying barrier between said main emitter region and said next adjacent region, a gate emitter region of the same conductivity type as said main emitter region also formed in said next adjacent region on the opposite side of said main emitter from said barrier contacted by said main current carrying electrode and adjacent said one surface of said body, said gate emitter region being spaced from said main emitter region and constituting an extended portion defined by at least one extended intersection with the said surface of the rectifying barrier between said gate emitter and said next adjacent region substantially parallel to the intersection with the said surface of the rectifying barriers between said main emitter region and said next adjacent region, a gate electrode extending over the long dimension of said gate emitter region and ohmically connected thereto, means for providing a localized concentrated low resistance path between only a limited portion of said gate electrode and the rectifying barrier between said next adjacent region and said main emitter region, said means including providing ohmic contact to said next adjacent region with a limited segment of that portion of said gate electrode extending along the elongated dimenison of said gate electrode.

2. A bilateral switching device as defined in claim 1 wherein said means for providing a localized concentrated low resistance path between a portion of said gate electrode and the said rectifying barrier between said next adjacent region and said main emitter region is defined by channels extending only a portion of the depth of said next adjacent region between said gate emitter region and said main emitter region over all but the said limited segment along the elongated dimension of said gate electrode which contacts said next adjacent region thereby defining a bridge of material of said next adjacent region which has a thickness greater than that of any other portion of said next adjacent region between said gate electrode and the said rectifying barrier between said next adjacent region and said main emitter region and as measured between the body surface and the rectifying barrier between said next adjacent region and the region opposite said main emitter region.

3. A bilateral switching device as defined in claim 2 wherein said material of said bridge which defines said localized path is of the same conductivity type as said next adjacent region and of a high conductivity relative thereto.

4. In a bilateral switching device wherein a gate electrode provides the control for switching the device between conducting and non-conducting states for a current path between a pair of main current carrying electrodes, a semiconductor body having a plurality of alternating regions, adjacent regions being of opposite conductivity type separated by rectifying barriers, one of said regions adjacent one surface of said body constituting a main emitter, said main emitter formed in the next adjacent region in such a manner as to be defined by at least a pair of extended spaced essentially parallel lines formed by intersections with the said one surface of the semiconductor body of the rectifying barrier between said main emitter and said next adjacent region whereby said next adjacent region is exposed at said one surface on both sides of said main emitter region, a main current carrying electrode in ohmic contact with said one surface of said body and extending over at least a portion of both said main emitter and said next adjacent region on only one side of said main emitter region thereby extending over a major portion of one of said extended intersections with the said surface of the rectifying barrier between said main emitter region and said next adjacent region, a gate emitter region of the same conductivity type as said main emitter region also formed in said next adjacent region on the opposite side of said main emitter from said barrier contacted by said main current carrying electrode and adjacent said one surface of said body, said gate emitter region being spaced from said main emitter region and constituting an extended portion defined by at least one extended intersection with the said surface of the rectifying barrier between said gate emitter and said next adjacent region substantially parallel to the intersection with the said surface of the rectifying barriers between said main emitter region and next adjacent region, a gate electrode extending over the long dimension of said gate emitter region and ohmically connected thereto, means for providing a localized concentrated low resistance path between a limited portion of said gate electrode and the rectifying barrier between said next adjacent region and said main emitter region, comprises providing said gate emitter region with a relatively small indentation along its elongated dimension and on the side opposite the extended intersection of said barrier with said one surface leaving an exposed portion of said next adjacent region which protrudes into said gate emitter region and extending said ohmic gate electrode over said exposed portion of said next adjacent region thereby to contact said next adjacent region only where said next adjacent region protrudes into said gate emitter region thereby to provide a localized concentrated low resistance path between a portion of said gate electrode and the rectifying barrier between said next adjacent region and said gate emitter region.

References Cited

UNITED STATES PATENTS

| | | | |
|---|---|---|---|
| 3,160,800 | 12/1964 | Smart | 317—235 |
| 3,243,669 | 3/1966 | Sah | 317—235 |
| 3,263,139 | 7/1966 | Turner | 317—235 |
| 3,274,463 | 9/1966 | Hutson | 317—235 |
| 3,280,392 | 10/1966 | Benda | 317—235 |

FOREIGN PATENTS

| | | |
|---|---|---|
| 1,324,170 | 3/1963 | France. |
| 1,156,510 | 10/1963 | Germany. |
| 153,976 | 10/1963 | U.S.S.R. |

OTHER REFERENCES

Electronics Design: "Bilateral SCR Lets Designer Economize on Circuitry," p. 74, Jan. 20, 1967.

JOHN W. HUCKERT, *Primary Examiner.*

J. D. CRAIG, *Assistant Examiner.*